United States Patent
Yoon et al.

(10) Patent No.: US 10,487,398 B2
(45) Date of Patent: Nov. 26, 2019

(54) SYNTHESIS OF METAL NITRIDE THIN FILMS MATERIALS USING HYDRAZINE DERIVATIVES

(71) Applicant: Applied Materials, Inc., Santa Clara, CA (US)

(72) Inventors: Byunghoon Yoon, Sunnyvale, CA (US); Seshadri Ganguli, Sunnyvale, CA (US); Siddarth Krishnan, Newark, CA (US); Paul F. Ma, Santa Clara, CA (US); Sang Ho Yu, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/830,608

(22) Filed: Dec. 4, 2017

(65) Prior Publication Data
US 2018/0155827 A1   Jun. 7, 2018

Related U.S. Application Data

(60) Provisional application No. 62/429,847, filed on Dec. 4, 2016.

(51) Int. Cl.
   *C23C 16/18*   (2006.01)
   *C23C 16/455*  (2006.01)
   *C23C 16/34*   (2006.01)
   *C23C 16/32*   (2006.01)

(52) U.S. Cl.
   CPC ............. *C23C 16/34* (2013.01); *C23C 16/18* (2013.01); *C23C 16/32* (2013.01); *C23C 16/45525* (2013.01); *C23C 16/45553* (2013.01)

(58) Field of Classification Search
   CPC .................... C23C 16/18; C23C 16/45525
   See application file for complete search history.

(56) References Cited

U.S. PATENT DOCUMENTS

| | | | | |
|---|---|---|---|---|
| 2008/0248648 A1* | 10/2008 | Thompson | ............... | C07F 17/00 438/681 |
| 2009/0302434 A1* | 12/2009 | Pallem | .................. | C07C 257/14 257/632 |
| 2010/0078601 A1* | 4/2010 | Pallem | .................... | C07F 17/00 252/512 |
| 2011/0263115 A1* | 10/2011 | Ganguli | .................. | C23C 16/06 438/595 |

* cited by examiner

*Primary Examiner* — Elizabeth A Burkhart
(74) *Attorney, Agent, or Firm* — Servilla Whitney LLC

(57) ABSTRACT

Methods for depositing a film comprising exposing a substrate surface to a metal precursor and a hydrazine derivative to form a metal containing film are described.

8 Claims, No Drawings

SYNTHESIS OF METAL NITRIDE THIN FILMS MATERIALS USING HYDRAZINE DERIVATIVES

CROSS-REFERENCE TO RELATED APPLICATIONS

This application claims priority to U.S. Provisional Application No. 62/429,847, filed Dec. 4, 2016, the entire disclosure of which is hereby incorporated by reference herein.

TECHNICAL FIELD

The present disclosure relates generally to methods of depositing thin films. In particular, the disclosure relates to methods of depositing films using hydrazine derivatives.

BACKGROUND

The push to engineer smaller and smaller microelectronic devices has opened up an increasing portion of the periodic table. While there is a large amount of research on lanthanide, Y and Sc inorganic and organometallic compounds, developing new compounds and exploring reactivity, there has been little progress in improving properties for vapor deposition methods. Lanthanide, Y and Sc metal compounds typically suffer from low volatility and a challenging balance to maintain both chemical stability and high enough reactivity with typical deposition co-reactants.

Typical lanthanum precursors demonstrate very low growth rates using ammonia as a co-reactant at low temperatures with low thermal stability. New lanthanide precursors and processes are needed to improve film growth rates and stability.

SUMMARY

One or more embodiments of the disclosure are directed to methods of forming a film. A substrate surface is exposed to a metal precursor and a hydrazine derivative at a temperature less than or equal to about 300° C. The metal precursor comprises a lanthanide.

Additional embodiments of the disclosure are directed to methods of forming a film comprising exposing a substrate surface to a metal precursor and a hydrazine derivative. The metal precursor comprises one or more of La, Ce, Pr, Nd, Pm, Sm, Eu, Gd, Tb, Dy, Ho, Er, Tm, Yb, Lu, Y or Sc. The substrate surface is at a temperature less than about 300° C.

Further embodiments of the disclosure are directed to methods comprising exposing a substrate surface to a metal precursor and a hydrazine derivative to form a metal nitride film. The metal precursor comprises a heteroleptic organometallic compound comprising a metal selected from one or more of La, Ce, Pr, Nd, Pm, Sm, Eu, Gd, Tb, Dy, Ho, Er, Tm, Yb, Lu, Y or Sc, and at least one substituted or unsubstituted cyclopentadienyl ligand. The hydrazine derivative comprises one or more of methylhydrazine, dimethylhydrazine, t-butylhydrazine or di(t-butyl)hydrazine. The substrate surface is at a temperature in the range of about 200° C. to about 250° C.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Embodiments of the disclosure advantageously provide methods of depositing a lanthanide, yttrium or scandium film. Some embodiments advantageously provide chemical vapor deposition (CVD) or atomic layer deposition (ALD) methods to deposit films using metal precursors with hydrazine derivatives. Some embodiments advantageously provide methods of depositing lanthanide films at temperatures below about 300° C.

The inventors have found that hydrazine derivatives can be useful co-reactants for lanthanide depositions at low temperatures. Generally, hydrazine derivatives are more expensive or difficult to obtain than hydrazine.

Liquid lanthanum precursors, such as lanthanum diisopropylcyclopentadienyl isopropylacetamidinate ($La(iPrCp)_2$(iPr-AMD)) show very low growth rates with ammonia as a co-reactant at low temperatures with low thermal stability. The inventors have found that lanthanum metal precursors and hydrazine derivatives at low temperature can produce high quality lanthanum films (e.g., LaN) with higher growth rates.

One or more embodiments of the disclosure are directed to the use of lanthanide, yttrium and scandium compounds for ALD, CVD and semiconductor doping applications. One or more embodiments are directed to processing methods comprising exposing a substrate surface to a metal precursor and a co-reactant to form a metal containing film. The metal precursor comprises a metal atom. The metal atom comprises one or more lanthanide.

Embodiments of the disclosure are directed to lanthanide, yttrium and scandium compounds reacted with hydrazine derivatives. As used in this specification and the appended claims, the term "lanthanide" means any element from the lanthanum series: lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu); and the term "lanthanide" also includes yttrium (Y) and scandium (Sc).

In some embodiments, metal compounds can be homoleptic or heteroleptic. In some embodiments, the metal precursor is a heteroleptic compound with one or two substituted or unsubstituted cyclopentadienyl ligand. Suitable metal precursors include, but are not limited to, $Cp_2Ln$ (allyl), $CpLn(allyl)_2$, $(allyl)_3Ln$, where Cp is a substituted or un-substituted cyclopentadienyl ligand, allyl is a substituted or un-substituted ally ligand, di(isopropylcyclopentadienyl) lanthanide isopropylacetamidinate $(iPrCp)_2Ln(iPr\text{-}AMD)$, where Ln is any of La, Ce, Pr, Nd, Pm, Sm, Eu, Gd, Tb, Dy, Ho, Er, Tm, Yb, Lu, Y or Sc.

In some embodiments, the metal precursor comprises a cyclopentadienyl ligand. The cyclopentadienyl ligand of one or more embodiments has the general formula $C_5R_5$, where each R is independently H, $C_{1-6}$ alkyl or $SiMe_3$. In some embodiments, the cyclopentadienyl ligand comprises $C_5Me_5$. In one or more embodiments, the cyclopentadienyl ligand comprises $C_5Me_4H$. In some embodiments, the cyclopentadienyl ligand comprises $C_5Me_4SiMe_3$. In some embodiments, at least one R group of the cyclopentadienyl ligand is an isopropyl group.

The hydrazine derivative can be any suitable hydrazine derivative having a general formula $N_2R_4$, where each R is independently H, branched or unbranched $C_{1-6}$ alkyl, branched or unbranched $C_{1-6}$ alkenyl, branched or unbranched $C_{1-6}$ alkynyl or cycloalkyl group, with the proviso that at least one of the R groups is not a hydrogen atom. Suitable hydrazine derivatives include, but are not limited to methylhydrazine, dimethylhydrazine, trimethylhydrazine, tetramethylhydrazine, ethylhydrazine, diethylhydrazine, triethylhydrazine, tetraethylhydrazine, ethylmethylhydrazine, ethyldimethylhydrazine, ethyltrimethylhydrazine, diethylmethylhydrazine, diethyldimethylhydrazine, triethylmethylhydrazine, propylhdrazine, isopropylhydrazine, dipropylhydrazine, tripropylhydrazine, tetrapropylhydrazine, diisopropylhydrazine, triisopropylhydrazine, tetraisopropylhydrazine, butylhydrazine, dibutylhydrazine, tributylhydrazine, tetrabutylhydrazine, t-butylhydrazine, di(tert-butyl)hydrazine, tri(tert-butyl)hydrazine, and/or tetra(tert-butyl)hydrazine.

The substrate temperature during formation of the metal film can be maintained at temperatures less than or equal to about 300° C. In some embodiments, the substrate temperature is in the range of about 150° C. to about 300° C., or in the range of about 200° C. to about 250° C.

The metal precursor can be reacted with oxidizing co-reactants such as $H_2O$, $O_2$, $O_3$, oxygen plasma, $H_2O_2$, NO or $NO_2$ to form a metal oxide film. As used in this regard, a "metal oxide" film comprises metal atom and oxygen atoms. A metal oxide film can be non-stoichiometric. A film "consisting essentially of" metal oxide has greater than or equal to about 95, 96, 97, 98 or 99 atomic percent metal and oxygen atoms.

The metal precursor is reacted with a hydrazine derivative in either a gas phase reaction (i.e., CVD process) or separate surface reactions (i.e., ALD process). In some embodiments, an additional co-reactant comprises one or more of NO, $NO_2$, $NH_3$, $N_2H_2$ or plasma thereof are used. Reaction with the hydrazine derivative can result in the formation of a metal nitride film. As used in this regard, a "metal nitride" film comprises metal atoms and nitrogen atoms. A metal nitride film can be non-stoichiometric. A film "consisting essentially of" metal nitride has greater than or equal to about 95, 96, 97, 98 or 99 atomic percent metal and nitrogen atoms.

In some embodiments, the co-reactant further comprises an organic species and the film comprises a metal carbide. Suitable organic species include, but are not limited to, propylene and acetylene. As used in this regard, a "metal carbide" film comprises metal atoms and carbon atoms. A metal carbide film can be non-stoichiometric. A film "consisting essentially of" metal carbide has greater than or equal to about 95, 96, 97, 98 or 99 atomic percent metal and carbon atoms.

In some embodiments, the metal containing film deposited comprises one or more of a metal carbide (MC), metal oxide (MO), metal nitride (MN), metal oxycarbide (MCO), metal oxynitride (MNO), metal carbonitride (MCO) or metal oxycarbonitride film (MCON). The metal carbide, metal oxide, metal nitride, metal oxycarbide, metal oxynitride, metal carbonitride and metal oxycarbonitride films are made up of the components named in any suitable amount, either stoichiometrically or non-stoichiometrically. A film that consists essentially of the named component has greater than or equal to about 95, 96, 97, 98 or 99 percent of the named components on an atomic basis.

In some embodiments, the film formed is a doped metal film in which dopant elements are added (e.g., B, P, As). Doping of the film can be done at the same time as film formation by, for example, addition of a dopant precursor, or separately by, for example, ion implantation.

The metal film can be deposited by a CVD process in which the metal precursor and the hydrazine derivative are mixed prior to or at the time of exposure to the substrate surface. Mixing the metal precursor and the hydrazine derivative may allow gas phase reactions which can deposit on the substrate surface.

In some embodiments, the metal film is deposited by an ALD process in which the metal-precursor and hydrazine derivative are exposed to the substrate surface separately and sequentially so that the metal precursor and hydrazine derivative do not mix. For example, in a time-domain ALD process, the entire substrate surface is exposed to the metal precursor and then the hydrazine derivative with a purge step between to prevent gas phase mixing. Only one of the metal precursor and the hydrazine derivative are flowed into the processing chamber at a time in the time-domain ALD process.

In a spatial ALD process, the metal precursor and the hydrazine derivative are flowed into different portions of the processing chamber and separated by, for example, a gas curtain or physical barrier to prevent gas phase mixing and reaction. In spatial ALD, a portion of the substrate surface may be exposed to the metal precursor and a separate portion of the substrate surface may be exposed to the hydrazine derivative at the same time while separating of the gases is maintained.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A method of forming a film, the method comprising exposing a substrate surface to a metal precursor and a hydrazine derivative at a temperature in a range of about 150° C. to about 250° C., the metal precursor is selected from $Cp_2La(allyl)$, $CpLa(allyl)_2$, $(allyl)La$, wherein Cp is a substituted or unsubstituted ligand, allyl is a substituted or unsubstituted allyl ligand, and the hydrazine derivative is selected from one or more of methylhydrazine, dimethylhydrazine, t-butylhydrazine, or di(t-butyl)hydrazine.

2. The method of claim 1, wherein the film further comprises one or more of a metal nitride, metal carbide, metal oxide, metal oxynitride, metal carbonitride, metal oxycarbonitride or metal oxycarbide.

3. The method of claim 1, wherein the metal precursor and the hydrazine derivative are exposed to the substrate surface in a mixture.

4. The method of claim 1, wherein the metal precursor and the hydrazine derivative are exposed to the substrate surface sequentially so that the metal precursor and hydrazine derivative do not mix.

5. A method of forming a film, the method comprising exposing a substrate surface to a metal precursor and a hydrazine derivative at a temperature in a range of about 150° C. to about 250° C., the metal precursor comprising diisopropylcyclopentadienyl lanthanum isopropylacetamidinate $(iPrCp)_2La(iPrAMD)$, and the hydrazine derivative is selected from one or more of methylhydrazine, dimethylhydrazine, t-butylhydrazine, or di(t-butyl)hydrazine.

6. The method of claim 5, wherein the film further comprises one or more of a metal nitride, metal carbide, metal oxide, metal oxynitride, metal carbonitride, metal oxycarbonitride or metal oxycarbide.

7. The method of claim 5, wherein the metal precursor and the hydrazine derivative are exposed to the substrate surface in a mixture.

8. The method of claim 5, wherein the metal precursor and the hydrazine derivative are exposed to the substrate surface sequentially so that the metal precursor and hydrazine derivative do not mix.

* * * * *

UNITED STATES PATENT AND TRADEMARK OFFICE
CERTIFICATE OF CORRECTION

PATENT NO. : 10,487,398 B2
APPLICATION NO. : 15/830608
DATED : November 26, 2019
INVENTOR(S) : Yoon et al.

Page 1 of 1

It is certified that error appears in the above-identified patent and that said Letters Patent is hereby corrected as shown below:

In the Claims

In Column 5, Line 10, in Claim 1, before "wherein" replace "(allyl)La" with "(allyl)$_3$La".

Signed and Sealed this
Fourth Day of February, 2020

Andrei Iancu
*Director of the United States Patent and Trademark Office*